United States Patent [19]

Tsuchida et al.

[11] Patent Number: 5,398,207

[45] Date of Patent: Mar. 14, 1995

[54] MOS RANDOM ACCESS MEMORY DEVICE WITH AN INTERNAL VOLTAGE-DOWN CONVERTING TRANSISTOR

[75] Inventors: Kenji Tsuchida, Kawasaki; Takashi Ohsawa, Yokohama, both of Japan

[73] Assignee: Kabushiki Kaisha Toshiba, Kawasaki, Japan

[21] Appl. No.: 67,629

[22] Filed: May 28, 1993

[30] Foreign Application Priority Data

May 29, 1992 [JP] Japan .................. 4-139430

[51] Int. Cl.$^6$ ............................................. G11C 13/00
[52] U.S. Cl. .................... 365/226; 365/149; 365/203; 365/204; 365/230.06
[58] Field of Search ........... 365/149, 203, 204, 230.06, 365/226

[56] References Cited

U.S. PATENT DOCUMENTS 5,103,113 4/1992 Inui et al. ............... 365/228
5,249,155 9/1993 Arimoto et al. .............. 365/226

OTHER PUBLICATIONS

IEEE Journal Of Solid-State Circuits, vol. 24, No. 5, Oct. 1989, pp. 1170–1175, Syuso Fujii, et al., "A 45-ns 16-Mbit DRAM With Triple-Well Structure."

Primary Examiner—Eugene R. LaRoche
Assistant Examiner—F. Niranjan
Attorney, Agent, or Firm—Oblon, Spivak, McClelland, Maier & Neustadt

[57] ABSTRACT

A MOS dynamic random access memory device has a memory cell array section formed on a semiconductor substrate, including memory cells each having a data storage capacitor and a transfer-gate transistor. Parallel bit lines are associated with the memory cell array section. Parallel word lines extend transverse to the bit lines, including a word line connected to the transfer-gate transistor. A booster circuit is arranged to provide a potentially raised voltage which is higher than a power supply voltage. A sense amplifier circuit is connected with a corresponding bit line pair of the word lines. A word-line driver circuit has an input connected to the booster circuit and an output connected to the word line. A bit-line restoring circuit is connected to the sense amplifier circuit. The restoring circuit includes a voltage-down converting metal oxide semiconductor field effect transistor having an insulated gate connected to the booster circuit, a drain coupled to the power supply voltage, and a source at which a potentially decreased voltage appears to be lower than the power supply voltage. The voltage-down converting transistor is same in channel conductivity type as the transfer-gate transistor.

27 Claims, 4 Drawing Sheets

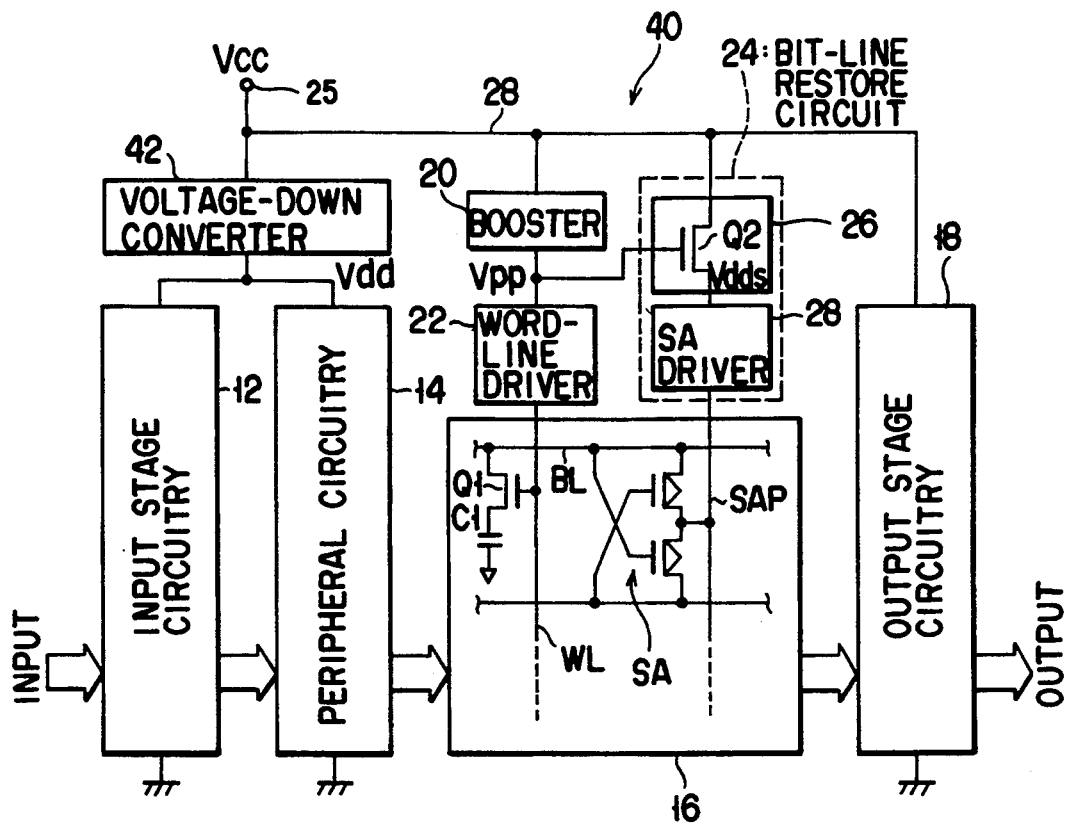
F I G. 6
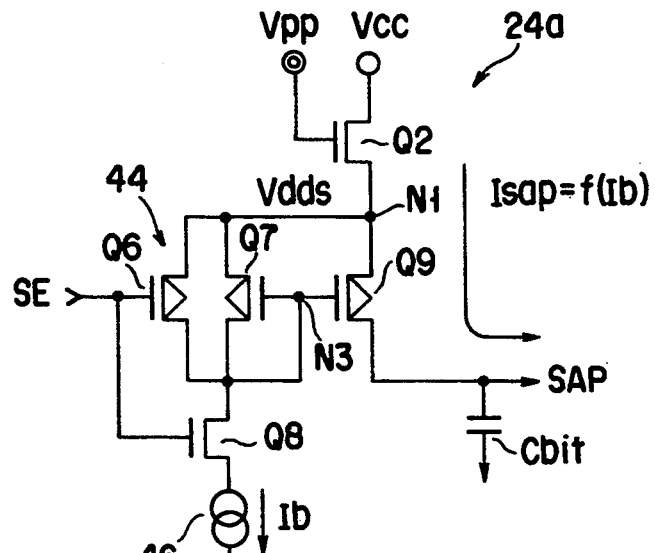
F I G. 7

MOS RANDOM ACCESS MEMORY DEVICE WITH AN INTERNAL VOLTAGE-DOWN CONVERTING TRANSISTOR

BACKGROUND OF THE INVENTION

1. Field of the Invention

The present invention relates generally to semiconductor memory devices and more particularly to highly integrated dynamic random-access memory (DRAM) devices using metal oxide semiconductor (MOS) transistors.

2. Description of the Related Art

In the manufacture of a digital equipment such as a computer, MOS dynamic random access memory (DRAM) devices are more widely used as the speed and cost advantages of these devices increase. The cost per bit of storage using MOS DRAMs has gone down as the number of bits or memory cells per package goes up. Such high integration of DRAMs comes with the advanced semiconductor microfabrication technology that breaks through the conventional design limit of on-chip element size.

As the semiconductor DRAM devices require higher packing density, the bit number increases and the cell size decreases. Accordingly, the setting of drive voltages internally applied in DRAM devices becomes more critical. While the DRAMs conventionally use the external power supply voltage Vcc, the internal drive voltages should be suitably adjusted so as to ensure that the reliability is as high as required.

In the presently available "semiconductor systems" having one or a plurality of circuit boards on which a various types of semiconductor devices are arranged or mounted including DRAM devices, central-processing units (CPUs), gate-array logic circuits and so forth, their basic power supply scheme has been kept unchanged wherein a single power supply voltage Vcc of a predetermined fixed standard potential (typically, +5 volts) is externally supplied to external power supply terminals of them. Highly integrated DRAMs are provided with a on-chip voltage converting circuit for converting the power supply voltage Vcc into a potentially decreased "down-converted" voltage for use in the drive voltages to achieve a suitable adjustment of the internal drive voltages. Such a circuit is generally known as a "voltage-down conversion (VDC) circuit" in the art to which the present invention pertains. The VDC circuit receives the power supply voltage Vcc externally supplied thereto, and generates a specific internal voltage that is potentially less than voltage Vcc.

VDC-included DRAM devices are described, for example, in Journal of Solid-State Circuits (JSSC), vol. 23, No. 5 "A 16-Mbit DRAM with a Relaxed Sense-Amplifier-Pitch Open-Bit-Line Architecture" (October 1988) at pp. 1104 to 1112. Similar DRAMs are also described in (1) JSSC, vol. 23, No. 5, "A 60-ns 16-Mbit CMOS DRAM with a Transposed Date-Line Structure" (October 1988) at pp. 113 to 1119, (2) JSSC, Vol. 24, No. 3, "An Experimental 16-Mbit CMOS DRAM Chip with a 100-MHz Serial READ/WRITE Mode" (June, 1989), at pp. 763 to 770, etc. The DRAMs as taught by these documents employ various kind of VDC circuits, including a VDC circuit for supplying an internally down-converted lower voltage to a memory cell array section only, a VDC circuit for supplying such down-converted voltage not only to the memory cell array section but also to the remaining circuit sections of a DRAM including peripheral circuits, and a VDC circuit for generating two kinds of down-converted voltages lower than the power supply voltage Vcc, one of which is for the memory cell array section, and the other of which is for the peripheral circuits.

As generally known among those skilled in the art, in the MOS DRAM devices, a voltage applied to a memory cell section determines the level of a logic "1" write (program) at a selected memory cell. The logic "1" write level is potentially equivalent to the bit-line restore voltage. To charge a bit line having a relatively large load toward a target potential level during a desirably shortened time period, a bit-line drive circuit requires an electric power of enhanced current supplying ability. Such requirement will be stronger as the integration density increases to increase the total bit-line capacity being charged or discharged within one row address strobe (RAS) cycle. This may cause an alternate current (AC) potential fluctuation to take place in the down-converted voltage internally generated in a DRAM chip. The AC potential fluctuation leads to the occurrence of a noise. The amount of noise will be a serious bar to the maintenance of an enhanced reliability in an event that the charging load capacitance, which is increased as the DRAM devices are further improved in integration density in future, is charged up or "restored" at a higher speed in a shortened RAS cycle.

A MOS DRAM device containing a conventional VDC circuit is described, for example, in JSSC, Vol. 24, No. 5, "A 45-ns 16-Mbit DRAM with Triple-Well Structure," October, 1989 at pp. 1170 to 1175. A sense amplifier as disclosed in FIG. 10 of it includes a driver transistor, which is connected to an external power supply voltage Vext and a common source line SAP of a restoring P-channel MOS sense amplifier circuit. A voltage comparator circuit is coupled to the common source line SAP. Common source line SAP begins to be charged by the driver transistor toward power supply voltage Vext in synchronism with a sense amplifier activation signal SE. The potential on common source line SAP increases gradually. When the comparator detects that the common source potential reaches a predetermined restore potential being equal to the down-converted voltage, the driver transistor is forced to turn off. The bit-line restore operation is then terminated.

More specifically, a current Isap flowing in the common source line SAP rushes to flow into the bit-line load capacitance by way of the driver transistor in synchronism with the sense amplifier activation signal SE. As common source line SAP rises potentially, the gate-to-drain voltage of the driver transistor decreases; common source current Isap decreases gradually. When the voltage on common source line SAP is finally at the restore voltage, the comparator detects it, causing the driver transistor to cut off. Common source current Isap becomes zero. When this transistor is cut off, the time varying rate di/dt of current Isap becomes the greatest value. The DRAM has an inductance component L that is inherent in the lead frame or bonding wires of its chip. Accordingly, an AC noise will occur which is determined by the product of the time varying rate di/dt and the inductance L, which is represented by "L·di/dt." The occurrence of such AC noise is a serious bar to the attainment of an excellent operating reliability of the DRAM device.

SUMMARY OF THE INVENTION

It is therefore an object of the present invention to provide a new and improved semiconductor memory device.

It is another object of the invention is to provide a new and improved highly integrated MOS DRAM device having a voltage-down converter to attain an enhanced reliability by suppressing or eliminating the occurrence of an internal noise.

In accordance with the above objects, the present invention is addressed to a specific semiconductor memory device, which includes a substrate, an array of rows and columns of memory cells on the substrate, each of the memory cells including a transistor and a capacitor. Word lines are coupled to the rows of memory cells, and bit lines are connected to the columns of memory cells. A word-line driver circuit is connected to the word lines. A restore circuit section is connected to the bit lines, for restoring a selected bit line associated with a presently selected one of the memory cells. A first voltage generator is connected to the power supply voltage of the memory device, for generating a first internal voltage which is greater in potential than the power supply voltage. A second voltage generator is coupled to the power supply voltage and the restore circuit section, for generating a second internal voltage which is less in potential than the power supply voltage, and for causing the second internal voltage to be supplied to the restore circuit means as a restoring voltage. The second voltage generator essentially consists of a transistor that is same in conductivity type as the transistors of memory cells, and has a first current-carrying electrode coupled to the power supply voltage, a second current-carrying electrode coupled to the restore circuit means, and a control electrode coupled to the first internal voltage.

The foregoing and other objects, features, and advantages of the invention will become apparent from the following more particular description of preferred embodiments of the invention, as illustrated in the accompanying drawings.

BRIEF DESCRIPTION OF THE DRAWINGS

FIG. 6 is a diagram showing the overall configuration of a MOS DRAM device in accordance with another embodiment of the invention.

FIG. 7 is a block diagram showing the internal configuration of a modification of a bit-line restore circuit shown in FIG. 3.

DETAILED DESCRIPTION OF THE PREFERRED EMBODIMENTS

Figure 1:
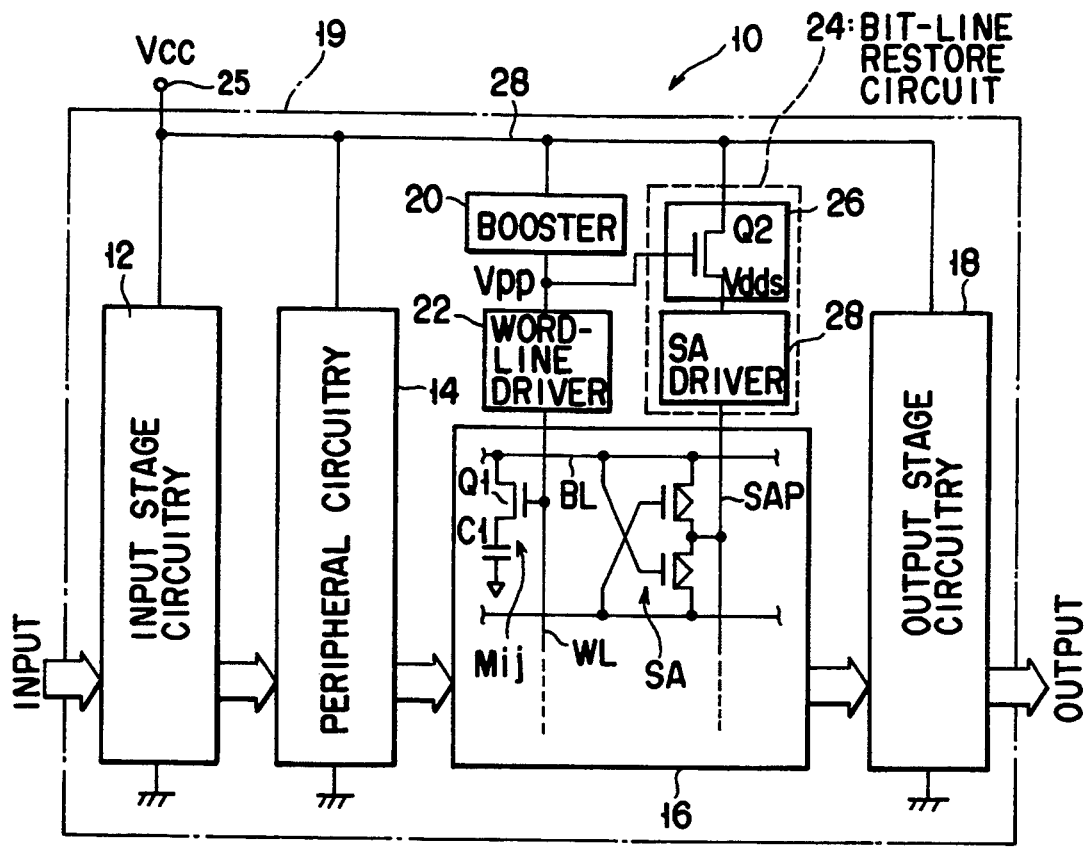
FIG. 1 is a diagram schematically showing the overall configuration of a MOS DRAM device in accordance with one preferred embodiment of the present invention.

Referring now to FIG. 1, a MOS dynamic randomaccess memory (DRAM) device in accordance with one preferred embodiment of the invention is generally designated by the numeral 10. The DRAM 10 includes an input stage circuit section 12, a peripheral circuit section 14, a memory cell array section 16 and an output stage circuit section 18. Note that a dash-dot line block 19 is used in FIG. 1 to show a silicon chip substrate, on which the above circuit sections are formed and integrated in a known manner among those skilled in the art of semiconductor memory devices. Peripheral circuit section 14 is connected to memory cell array section 16, and is responsive to the output signal(s) of input stage circuit section 12. Output stage circuit section 18 is coupled to the output of memory cell array section 16, and includes a plurality of known circuits for sending forth an access data externally.

The memory cell array section 16 includes a plurality of rows and columns of memory cells M that are arranged at the crossing points as defined between parallel word lines WL and parallel bit lines BL extending transverse thereto. Each memory cell Mij has an N-channel conductivity type metal oxide semiconductor (MOS) field effect transistor Q1 and a capacitive element C1 for data storage coupled to transistor Q1 as shown in FIG. 1. The capacitive element may be a MOS capacitor. MOS transistor Q1 is arranged between the data-storage capacitor C1 and a corresponding one of bit lines BL to function as a data transfer gate. In FIG. 1, a single memory cell (one-transistor/one-capacitor memory cell) is indicated for purposes of illustration only; the remaining memory cells are arranged similarly. The memory cell array section 16 also includes a plurality of dummy bit lines each of which forms a pair with a corresponding bit line in substantially the manner as in presently available MOS DRAMs, wherein each dummy bit line is associated with well-known one-transistor/one-capacitor dummy memory cells, which are not visible in FIG. 1.

As shown in FIG. 1, the memory cell array section 16 is connected to a booster circuit 20, a word-line drive circuit 22 and a bit-line restore circuit 24. Booster circuit 20 and bit-line restore circuit 24 are connected by a wiring line 28 to an external power supply terminal 25, together with the input-stage circuit section 12, the peripheral circuit section 14 and the output-stage circuit section 18. Terminal 25 is externally supplied with a direct current (DC) power supply voltage Vcc. Booster circuit 20 has a boosting circuit configuration for causing the power supply voltage Vcc to increase in potential, thereby to generate an internally boosted high voltage Vpp. This high voltage Vpp is supplied to word-line driver 22. Voltage Vpp defines the High or "H" level potential of word lines WL. Word-line driver 22 is connected through word lines WL to memory cell array section 16.

The bit-line restore circuit 24 includes a voltage-down converter or VDC circuit 26 and a sense-amplifier or SA driver circuit 28. VDC circuit 26 receives the boosted high voltage Vpp generated by booster circuit 20, and generates a specific voltage Vdds that is potentially lower than the power supply voltage Vcc. The down-converted voltage Vdds is supplied to SA driver circuit 28. SA driver 28 is connected by a common source line SAP to well-known P-channel MOS (PMOS) sense amplifier circuits SA, which are arranged at the plurality of bit line pairs respectively. Each PMOS sense amplifier includes two PMOS transistors that are cross-coupled to each other at their insulated gate electrodes.

Very importantly, the VDC circuit 26 includes an N-channel MOS (NMOS) transistor Q2, which has an insulated gate electrode coupled to the output of the booster circuit 20, a drain electrode coupled to the Vcc line 28, and a source electrode coupled to the common source line SAP through the SA driver 28. NMOS transistor Q2 generates the down-converted voltage Vdds at its source electrode. The generation of such voltage Vdds is based on the following fact: transistor Q2 has inherently a predetermined threshold voltage vth (which may be considered as the internal potential drop between the gate and source of this transistor); therefore, its potential drop source voltage (Vdds) may be represented by $$Vdds = Vpp - vth < Vcc. \quad (1)$$

In other words, VDC circuit 26 of FIG. 1 differs from conventional VDC circuits in that VDC circuit 26 does not require any voltage comparator circuit.

Figure 2:
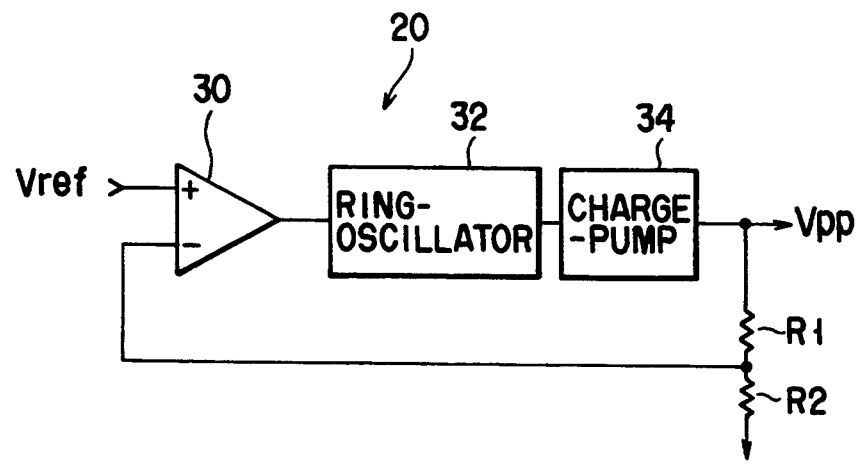
FIG. 2 is a block diagram showing the internal arrangement of a booster circuit used in the DRAM of FIG. 1.

An exemplary circuit configuration of the booster circuit 20 of FIG. 1 is shown in FIG. 2, wherein booster 20 is basically constituted using an oscillator circuit and a charge-pump circuit, which are on-chip components. Such circuit configuration is well known among those skilled in the semiconductor memory art, and is shown, for example, in Journal of Solid-State Circuits (JSSC), Vol. 26, No. 4, "An Experimental 1.5-V 64-Mbit DRAM" (April, 1991) at pp. 465 to 472. A similar circuit configuration is also described in 1991 VLSI Circuit Sympo. Digest of Tech. Papers, "Circuit Techniques for a Wide Word I/O Path 64 Meg DRAM" at pp. 133 to 134.

As shown in FIG. 2, the booster circuit 20 includes a voltage comparator circuit 30 that consists of a two-input differential amplifier. Comparator 30 has a non-inverting input coupled to a reference voltage Vref, an inverting input and an output. The output of comparator 30 is coupled to a ring oscillator circuit 32. Ring-oscillator 32 has an output coupled to a charge-pump circuit 34. Charge-pump circuit 34 performs a charge pumping operation in response to oscillator 32, and generates the boosted high voltage Vpp at its output. The output of charge-pump circuit 34 is connected through a feed-back resistor R1 to the inverting input of comparator 30. Another resistor R2 is connected in series to resistor R1. Comparator 30 compares a high voltage Vpp being presently fed back thereto with reference voltage Vref; when voltage Vpp is potentially equivalent to reference voltage Vref, comparator 30 controls oscillator 32 so that charge pump 34 terminates its boosting operation. Such an arrangement may ensure that voltage Vpp is generated continuously while voltage Vpp is essentially insensitive to the occurrence of potential variations in the power supply voltage Vcc.

Figure 3:
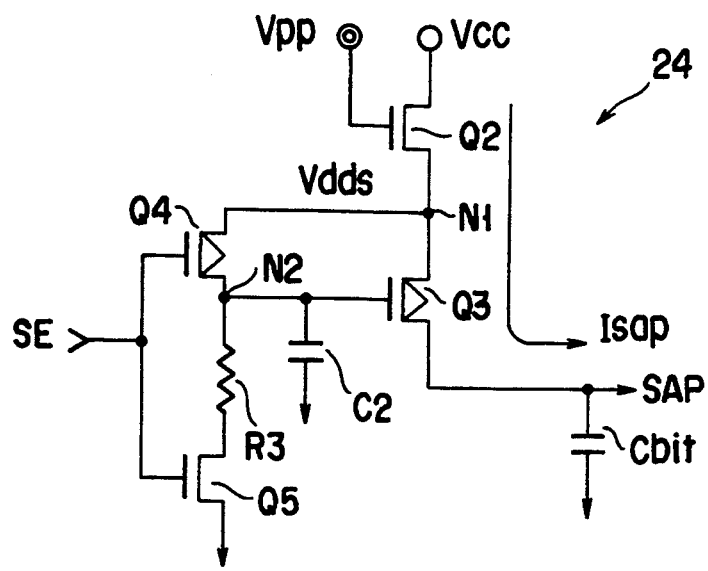
FIG. 3 is a circuit diagram showing the internal arrangement of a bit-line restore circuit of FIG. 1.

The bit-line restore circuit 24 of FIG. 1 may be arranged as shown in FIG. 3. A PMOS transistor Q3 is series-connected at a circuit node N1 to the voltage-down converting transistor Q2. The source electrode of transistor Q3 is coupled to the common source line SAP, thereby to provide a current flow path for allowing a current Isap to flow through transistors Q2, Q3 into line SAP. The gate electrode of transistor Q3 is coupled to a circuit node N2 whereat a PMOS transistor Q4 is connected to an NMOS transistor Q5 through a resistor R3. Node N2 is associated with a capacitor C2. The gate electrodes of transistors Q4, Q5 are coupled together to receive a sense-amplifier activation control signal SE.

Figure 4:
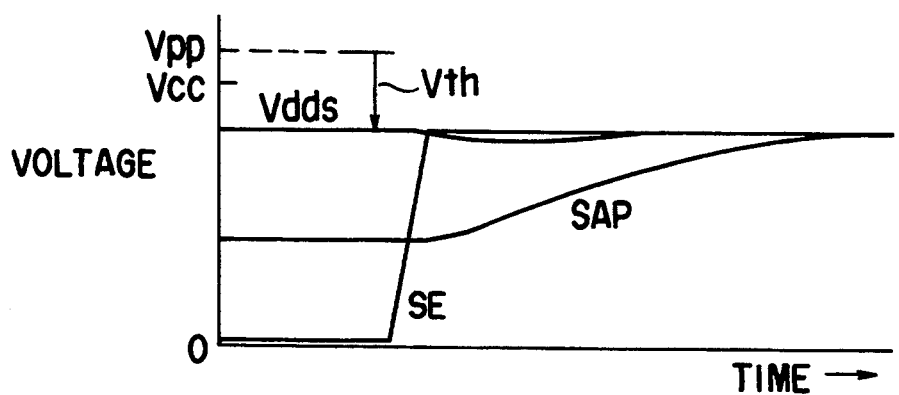
FIG. 4 is a graphic representation of the waveforms of main voltage signals generated during a sense-amplifier activation operation by a restore circuit of FIG. 3 plotted as a function of time.

The bit-line restore circuit 24 of FIG. 3 operates as follows. When the DRAM 10 is in the stand-by state, the sense amplifier activation signal SE is maintained at the low potential level as shown in FIG. 4. The common source line SAP of PMOS sense-amplifier circuit SA is precharged up to a predetermined potential level (precharge level). This precharge level is equivalent to the half the down-converted lower voltage Vdds, for example. Voltage Vdds is held at "Vpp−vth."

Figure 5:
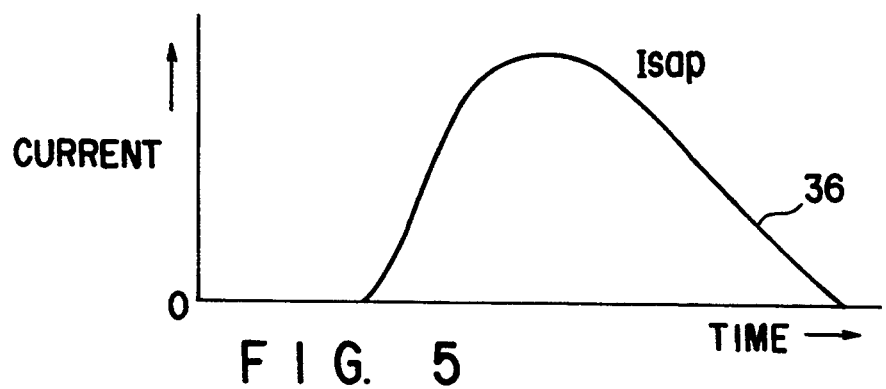
FIG. 5 is a graphic representation of a restore current Isap supplied by the restore circuit of FIG. 3, plotted as a function of time.

When the DRAM 10 is rendered active, the sense amplifier activation signal SE becomes at a high level with a certain timing. In synchronism with this potential change of signal SE, a bit-line restore operation is initiated. A restore current Isap flows by way of the transistors Q2, Q3 of FIG. 3, thus charging a load capacitance Cbit of the common source line SAP. At this time, the restore current Isap decreased gradually as shown in FIG. 5. A down slope 36 of a current characteristic curve of FIG. 5 is moderate; this means that the current change di/dt remains lower at the termination of restore operation. Such moderate decrease of restore current Isap is due to the fact that the source-to-drain voltage of transistor Q3 goes lower gradually. The decrease of di/dt during the restore operation assures that the power supply noise (L·di/dt) caused due to the inductance of the DRAM chip is kept smaller as desired. Therefore, the DRAM 10 can operate stably.

The significant feature of the embodiment DRAM 10 is that the bit-line restore circuit 24 employs the NMOS transistor Q2 in the alternative of a voltage comparator that has been conventionally used therein. More specifically, with DRAM 10, bit-line restore circuit 24 includes NMOS transistor Q2 which has the gate electrode, to which the word-line driving boosted voltage Vpp is supplied, and the drain electrode coupled to the power supply voltage Vcc, and which generates as the bit-line restore voltage a specific voltage Vpp−vth that potentially corresponds to the threshold-voltage drop of transistor Q2. This can cause the restore current to decrease gradually as the restore operation continues, as shown by the moderate down slope 36 in the graph of FIG. 5. It is thus possible to reduce successfully the "di/dt" noise that may take place due to the operation of a voltage comparator during a restore operation in the prior art. As a result, the operation stability can be improved while having the occurrence of noise minimized.

Another significant feature of the DRAM 10 is that the voltage-down converting transistor Q2 is a specifically selected MOS transistor which is same in channel conductivity type as the transistor Q1 arranged in each memory cell Mij of the memory cell array section 16. More preferably, VDC transistor Q2 should be carefully designed so that transistor Q2 is substantially identical in threshold voltage with memory cell transfer-gate transistor Q1. This is important because, in such a case, the bit-line restore voltage can be "self-aligned" with memory cells M. More specifically, while it is sufficient that the restore voltage is same as the voltage at the storage node of each memory cell (that is, the node of the memory cell capacitor C1 of FIG. 1), if the threshold voltage vth of transistor Q2 is lower than the threshold voltage of memory cell transistors, the restore voltage is potentially higher than the storage-node voltage, which leads to the occurrence of an unnecessary power consumption. (Even under such a condition, no serious problems will take place with respect to the fundamental operations.) On the other hand, if the threshold voltage Vth of transistor Q2 is higher than that of memory cell transistors, a resultant restore voltage gets lower to make it difficult or impossible to let the sufficient amount of charge carriers be stored for data write at the storage node of a memory cell. If transistor Q2 is equal in threshold voltage to memory cell transfer-gate transistor Q1, it is possible to successfully write a bit-line restore voltage into the memory cell storage node while preventing the occurrence of an unnecessary increase in power consumption.

A still another significant feature of the MOS DRAM 10 is that the boosted high voltage Vpp which is internally raised in potential from the power supply voltage Vcc is used in the prestage of the generation of down-converted voltage Vdds. Principally, the significance of such "boosted voltage Vpp using" feature is that the occurrence of an internal noise can be suppressed or eliminated while assuring that the cell accessing rate of DRAM 10 can be enhanced by compensating for an internal voltage drop while a high-level voltage is written into a selected memory cell, thus shortening a necessary time period required for a word-line drive operation of highly integrated MOS DRAM 10.

More specifically, MOS DRAMs are generally required to be driven using a voltage higher than the power supply voltage Vcc for a corresponding word line in order to compensate for an undesirable voltage drop called the "threshold voltage drop" at its associated transfer-gate transistor included therein (Q1 of FIG. 1) when a write voltage same as the power supply voltage Vcc is given to a selected memory cell. In the prior art, a bootstrap circuit has been used to internally generate such a voltage. This circuit is the one which generates a voltage higher than the power supply voltage Vcc by utilizing the known capacitor coupling in synchronism with a certain timing. However, such approach suffers from the following problems: (1) it is necessary to electrically drive a word-line drive signal line of heavy load, and (2) the NMOS source-follower circuit itself remains lower in operation speed inherently. Evidently, these problems are a serious bar to the achievement of a high-speed DRAM. In addition, the bootstrapped voltage obtained by the bootstrap circuit is simply proportional in potential to the external power supply voltage Vcc. Typically, when the power supply voltage Vcc is +5 volts, the bootstrapped voltage is selected to be +7.5 volts, which is 1.5 times the voltage Vcc. If a DRAM operates at a higher side level of the allowable range of power supply voltage Vcc (i.e., Vcc +10%), the electric field will become stronger undesirably in the gate oxide film of the memory-cell transfer-gate transistor. The occurrence of such a high electric field leads to a decrease in the reliability of DRAM 10.

According to the MOS DRAM device 10 with the booster 20, the data storage capacitor C1 of a selected memory cell is applied with the voltage corresponding to the difference between bootstrapped voltage vpp and the threshold voltage vth of transfer-gate transistor Q1 as an effective voltage as explained previously. This fact indicates that it is satisfactory that the restore voltage (down-converted voltage Vdds) to be supplied to the sense-amplifier driver circuit 28 of the bit-line restore circuit 24 is also set at the same potential level. By taking account of these circumstances, the embodiment DRAM 10 employs the oscillator/charge-pump coarranged booster circuit 20 shown in FIG. 2, which contributes to the accomplishment of a high-reliability/-high-integrated MOS DRAM device.

A DRAM device 40 shown in FIG. 6 is similar to that of FIG. 1 with a voltage-down converter (VDC) circuit 42 being added. Note that, in FIG. 6, the dash-dot line block 19 as used in FIG. 1 to show the substrate is deleted for purposes of illustration only. VDC circuit 42 is connected to the input state circuitry 12 and the peripheral circuitry 14, for providing them with a potentially decreased voltage Vdd as a drive voltage therefor. With such an arrangement, it is possible to enlarge the operating margin of peripheral circuits of the DRAM. Here, the peripheral circuits may be defined as a circuit section that excludes memory cell array section 16 and drive circuits therefor such as word-line driver circuit 22 and bit-line restore circuit 24; in this embodiment, the above "peripheral circuits" correspond to circuit sections 12, 14.

The bit-line restore circuit 24 of FIG. 3 may be modified as shown in FIG. 7, wherein a bit-line restore circuit 24a is illustrated which differs from that of FIG. 3 in that a charging current controller circuit section 44 is additionally provided for causing the current peak to decrease during the operation of restore circuit 24a. Such current peak decrease may also be effective with respect to the reduction of power supply noise generation.

The charge-current controller 44 includes parallel-connected PMOS transistors Q6, Q7, which are commonly coupled at their source and drain electrodes. The commonly coupled drain electrodes of transistors Q6, Q7 are connected to the node N1. The commonly coupled source electrodes of transistors Q6, Q7 are connected to a current source 46 through an NMOS transistor Q8, which has a gate electrode coupled to the gate of transistor Q6. The source of transistor Q7 is connected to the gate of it at a circuit node N3. This node N3 is connected to the gate electrode of a PMOS transistor Q9, which acts as a driver transistor that is associated with the voltage-drop converting current-biasing transistor Q2. Transistors Q7, Q9 provide a current-mirror circuit configuration.

Figure 8:
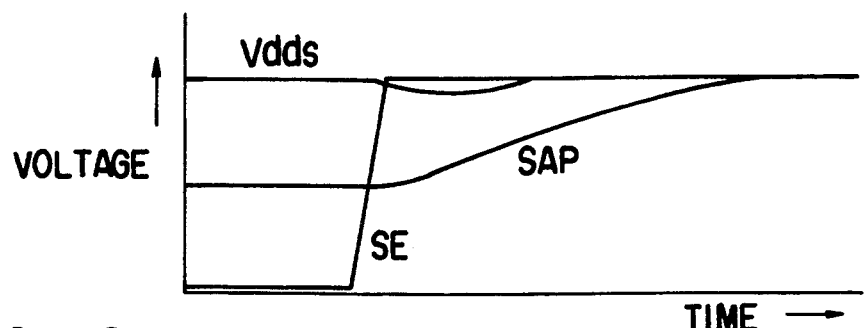
FIG. 8 is a graphic representation of the waveforms of main voltage signals generated during a sense-amplifier activating operation by the restore circuit of FIG. 7, plotted as a function of time.
Figure 9:
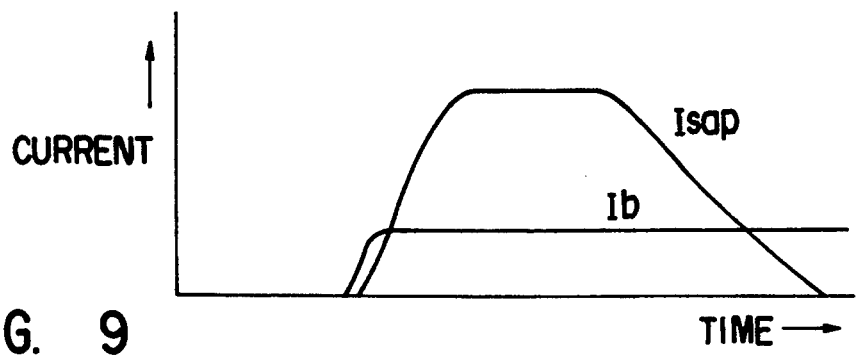
FIG. 9 is a graphic representation of a restore current Isap supplied by the restore circuit of FIG. 7, plotted as a function of time.

The bit-line restore circuit 24a of FIG. 7 operates as follows. A current Ib flows in the current bias stage in synchronism with the sense amplifier activation signal SE, which rapidly rises in potential from the "L" level toward the "H" level as shown in the voltage waveform diagram of FIG. 8. Current Ib exhibits a constant current value as shown in FIG. 9. Since transistors Q7, Q9 are of the current-mirror circuit configuration, the restore current Isap is a mirror current of current Ib. Assume that the gate widths of transistors Q7, Q9 are W7, W9. In the maximum case, restore current Isap is a constant current that is defined as follows:

$$Isap = Ib \times (w9/W7). \qquad (2)$$

As a result, the peak of charging current can be decreased.

As the restore operation continues, the source-to-drain voltage of transistor Q9 gets smaller gradually. The operation region of transistor Q9 is thus shifted from the pentode transistor operating region to the triode transistor operating region. Therefore, the di/dt at the termination of restore operation can be rendered smaller extremely in the same manner as in the previous embodiment shown in FIG. 1. As a result, the occurrence of power supply noise can be suppressed or eliminated. This may contribute to the achievement of a highly integrated DRAM device of high-speed/high-reliability.

Figure 10:
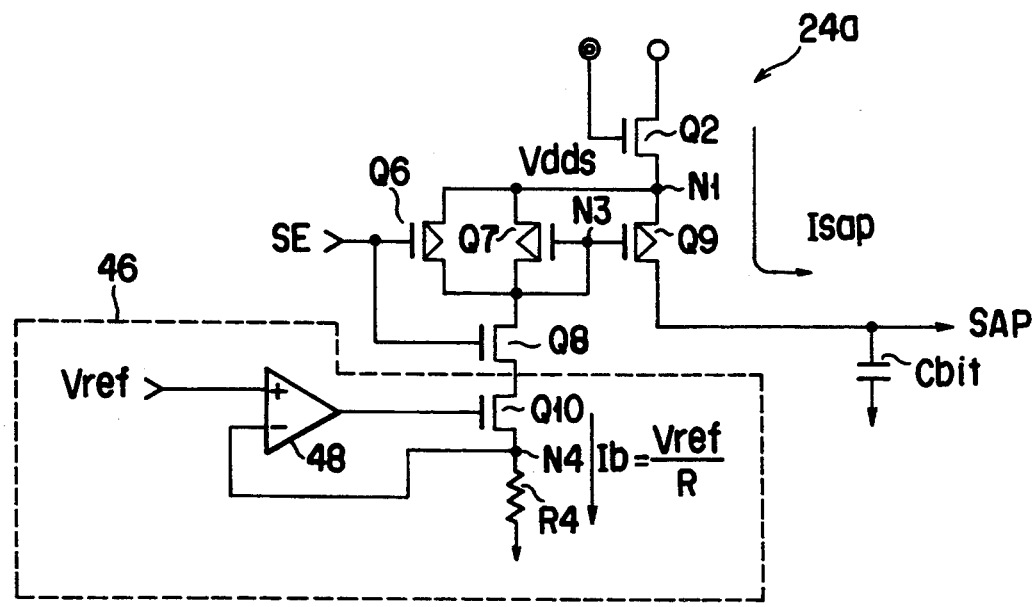
FIG. 10 is a diagram showing the internal configuration of a constant current source circuit of FIG. 7.

The constant current source 46 of FIG. 7 may be arranged as shown in FIG. 10, wherein constant current source 46 includes a differential amplifier 48 having an inverting input, a non-inverting input coupled to a reference voltage Vref, and an output connected to the gate electrode of an NMOS transistor Q10, which functions as a voltage-to-current converting device. Transistor Q10 is series-connected to the transistor Q8. Transistor Q10 has a source electrode coupled to a reference resistor R4 at a circuit node N4, which node is connected to the inverting input of differential amplifier 48.

With such an arrangement, the differential amplifier 48 controls the gate potential of transistor Q10 so that the voltage at node N4 remains equivalent to the reference voltage Vref at any time. This results in that a bias current Ib flows in the current bias stage constantly in any event, which current Ib may be defined as follows:

$$Ib = Vref/R4, \qquad (3)$$

where R4 is the resistance of resistor R4. Referring to Equation 2 and 3, the restore current Isap is represented as follows:

$$Isap = (Vref/R4) \times (W9/W7). \qquad (4)$$

Reference voltage Vref may preferably be a constant voltage that is insensitive to variations in the power supply voltage Vcc; in such a case, current Ib has a fixed value that is determined by the resistance value of resistor R4. It is also preferable that a temperature compensator unit is added to reference voltage Vref; in such case, voltage Vref can also be insensitive to variations in the ambient temperature, causing the operating stability to be greater. A band-gap reference circuit using bipolar transistors may be employed as such temperature compensator.

The present invention is not limited to the above-described specific embodiments and may be practiced or embodied in still other ways without departing from the spirit or essential character thereof.

The bit-line restore circuit 24 may be arranged differently as far as the NMOS transistor, which has the gate electrode to which the boosted voltage vpp is input and the drain coupled to the power supply voltage Vcc, is used as the basic component for the voltage down circuit. In addition, the present invention may also be applicable to several semiconductor memory devices which have different memory cell structures other than the aforementioned one-transistor/one-capacitor memory cell structure.

What is claimed is:

1. A semiconductor memory device comprising:
   a semiconductor substrate;
   an array of rows and columns of memory cells formed on said semiconductor substrate, each of said memory cells including a transistor and a capacitor;
   word lines coupled to said rows of memory cells;
   bit lines coupled to said columns of memory cells;
   a word-line driver circuit coupled to said word lines;
   restore circuit means coupled to said bit lines for restoring a selected one of said bit lines, associated with a presently selected one of said memory cells; and
   first voltage generator means coupled to a power supply voltage, for generating a first internal voltage which is greater in potential than said power supply voltage, said first internal voltage being applied to a control electrode of said transistor,
   wherein said restore circuit means includes second voltage generator means coupled to said power supply voltage, for generating a second internal voltage which is lower in potential than said power supply voltage, and means for causing said second internal voltage to be supplied to said bit lines as a restoring voltage, said second voltage generator means essentially consisting of a transistor having substantially the same threshold voltage as that of said transistor of each memory cell, and said transistor of said second voltage generator means having a first current carrying electrode supplied with said power supply voltage, a second current-carrying electrode coupled to said bit lines, and a control electrode coupled to said first voltage generator means.

2. The semiconductor memory device according to claim 1, wherein said transistor of said second voltage generator means includes a metal insulator semiconductor transistor having an insulated gate electrode coupled to said first voltage generator means.

3. The semiconductor memory device according to claim 2, wherein said first voltage generator means and said second voltage generator means are arranged on said semiconductor substrate.

4. The semiconductor memory device according to claim 3, wherein said metal insulator semiconductor transistor is included in said semiconductor restore circuit means on said substrate.

5. The semiconductor memory device according to claim 3, wherein said metal insulator semiconductor transistor includes a metal oxide semiconductor field effect transistor or MOSFET of a chosen channel conductivity type.

6. The semiconductor memory device according to claim 3, wherein said first voltage generator means includes a booster circuit for generating a potentially increased voltage as said first internal voltage.

7. The semiconductor memory device according to claim 6, wherein said booster circuit includes:
   an operational amplifier having an inverting input terminal, a non-inverting input terminal, and an output terminal;
   an oscillator having an input terminal coupled to said output terminal of said operational amplifier, and an output terminal; and
   a charge-pump circuit having an input terminal coupled to said output terminal of said oscillator and an output terminal coupled to said inverting input terminal of said operational amplifier.

8. The semiconductor memory device according to claim 2, further comprising:

a voltage-down converter circuit coupled to a peripheral circuit associated with said array of rows and columns of memory cells.

9. The semiconductor memory device according to claim 2, wherein said restore circuit means includes a constant current supply circuit.

10. The semiconductor memory device according to claim 9, wherein said constant current supply circuit includes:
   a differential amplifier having a first input terminal supplied with a reference voltage, a second input terminal, and an output terminal; and
   a transistor having a gate electrode coupled to said output terminal of said differential amplifier, and a current-carrying electrode coupled to said second input terminal of said differential amplifier.

11. A dynamic random access memory comprising:
   a semiconductor substrate;
   a memory cell array section including a plurality of memory cells which have data storage elements and transfer-gate transistors respectively;
   parallel bit lines associated with said memory cell array section;
   parallel word lines formed transverse to said bit lines and connected to said transfer-gate transistors of said memory cells;
   a word-line driver circuit connected to said word lines;
   a restoring circuit connected to said bit lines;
   first means for providing said word-line driver circuit with a first voltage which is potentially higher than a power supply voltage externally supplied to said dynamic random access memory; and
   second means, connected to said restoring circuit, for providing said restoring circuit with a second voltage which is potentially lower than said power supply voltage, said second means including a transistor having substantially the same threshold voltage as that of said transfer-gate transistors and a gate electrode coupled to said first means.

12. The dynamic random access memory according to claim 11, wherein said transistor of said second means does not have a greater threshold voltage than that of said transfer-gate transistors.

13. The dynamic random access memory according to claim 12, wherein said transistor of said second means has a threshold voltage which is substantially equivalent to that of said transfer-gate transistors.

14. The dynamic random access memory according to claim 11, wherein said first means comprises a circuit arranged on said semiconductor substrate for internally generating a potentially increased voltage with respect to said power supply voltage.

15. The dynamic random access memory according to claim 14, wherein said transistor has a drain electrode supplied with said power supply voltage and a source electrode coupled to said restoring circuit, said gate electrode of said transistor being also coupled to said word-line driver circuit.

16. The dynamic random access memory according to claim 15, further comprising:
   an input stage circuit section;
   a peripheral circuit section having an input terminal connected to said input stage circuit section and an output terminal connected to said memory cell array section; and
   a voltage-down converter circuit having an input terminal supplied with said power supply voltage and an output terminal connected to said input-stage circuit section and said peripheral circuit section.

17. The dynamic random access memory according to claim 13, wherein said transistor of said second means and said transfer-gate transistors include field effect transistors.

18. The dynamic random access memory according to claim 17, wherein said field effect transistors are metal oxide semiconductor field effect transistors of N type channel conductivity.

19. A dynamic random access memory system comprising:
   a memory cell array section including a plurality of memory cells each of which has a data storage element and a transfer-gate transistor with a control gate electrode;
   parallel bit lines associated with said memory cell array section, said parallel bit lines including a bit line pair;
   parallel word lines formed transverse to said parallel bit lines, including a word line connected to said control gate electrode of said transfer-gate transistor;
   booster circuit means supplied with a power supply voltage, for providing a potentially raised voltage which is higher than said power supply voltage;
   a sense amplifier circuit associated with said bit line pair;
   a word-line driver circuit having an input terminal connected to said booster circuit means and an output terminal connected to said word line; and
   a restoring circuit connected to said sense amplifier circuit, said restoring circuit including a voltage-down converting metal oxide semiconductor field effect transistor having an insulated gate electrode connected to said booster circuit means, a drain electrode supplied with said power supply voltage, and a source electrode whereat a potentially decreased voltage appears which is lower than said power supply voltage, said voltage-down converting transistor having substantially the same threshold voltage as that of said transfer-gate transistor.

20. The dynamic random access memory system according to claim 19, wherein said restoring circuit includes a sense-amplifier driver circuit having an input terminal connected to said source electrode of said voltage-down converting transistor and an output terminal connected to said sense amplifier circuit.

21. The dynamic random access memory system according to claim 20, wherein said voltage-down converting transistor does not have a greater threshold voltage than that of said transfer-gate transistor.

22. The dynamic random access memory system according to claim 21, wherein said voltage-down converting transistor and said transfer-gate transistor are of an N channel conductivity type.

23. The dynamic random access memory system according to claim 22, wherein said voltage-down converting transistor has a threshold voltage substantially equal to that of said transfer-gate transistor.

24. The dynamic random access memory system according to claim 23, further comprising:
   an input stage circuit section;
   a peripheral circuit section having an input terminal connected to said input stage circuit section and an output terminal connected to said memory cell array section; and a voltage-down converter circuit having an input terminal supplied with said power supply voltage and an output terminal connected to said input-stage circuit section and said peripheral circuit section.

25. The dynamic random access memory system according to claim 24, wherein said restoring circuit comprises:

a second metal oxide semiconductor field effect transistor connected between said sense amplifier circuit and said source electrode of said voltage-down converting transistor; and charge current controller means connected to said second transistor, for decreasing a peak of a restoring current supplied through said second transistor to said sense amplifier circuit.

26. The dynamic random access memory system according to claim 25, wherein said second transistor has an N channel conductivity type.

27. The dynamic random access memory system according to claim 25, wherein said charge current controller means comprises:

a constant current supplying circuit including a differential amplifier, a reference resistor, and a voltage-to-current converting transistor.

* * * * *